(12) United States Patent
Vilas Boas et al.

(10) Patent No.: US 8,253,453 B2
(45) Date of Patent: Aug. 28, 2012

(54) BROWN-OUT DETECTION CIRCUIT

(75) Inventors: Andre Luis Vilas Boas, Campinas (BR);
Chris C. Dao, Pflugerville, TX (US);
Stefano Pietri, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 74 days.

(21) Appl. No.: 12/914,168

(22) Filed: Oct. 28, 2010

(65) Prior Publication Data
US 2012/0105108 A1 May 3, 2012

(51) Int. Cl.
*H03K 3/02* (2006.01)
*H03K 5/153* (2006.01)

(52) U.S. Cl. ............. 327/143; 327/77; 327/78; 327/198

(58) Field of Classification Search .................... 327/77, 327/78, 80, 81, 142, 143, 198
See application file for complete search history.

(56) References Cited

U.S. PATENT DOCUMENTS

| | | | |
|---|---|---|---|
| 4,703,191 A | 10/1987 | Ferguson | |
| 5,187,389 A * | 2/1993 | Hall et al. | 327/50 |
| 5,564,010 A | 10/1996 | Henry et al. | |
| 5,943,635 A | 8/1999 | Inn | |
| 6,246,626 B1 | 6/2001 | Roohparvar | |
| 6,366,521 B1 | 4/2002 | Roohparvar | |
| 6,472,912 B1 * | 10/2002 | Chiu et al. | 327/143 |
| 7,482,847 B2 | 1/2009 | Suzuki | |
| 7,495,875 B2 | 2/2009 | Lin | |
| 7,525,353 B2 | 4/2009 | Wadhwa et al. | |
| 7,821,307 B2 * | 10/2010 | Chellappa | 327/143 |
| 2003/0227306 A1 | 12/2003 | Di Iorio | |
| 2011/0185212 A1 * | 7/2011 | Dao et al. | 713/340 |
| 2012/0013365 A1 * | 1/2012 | Vilas Boas et al. | 327/72 |

OTHER PUBLICATIONS

Dao, et al., U.S. Appl. No. 12/694,023, filed Jan. 26, 2010, "Data Processing System Having Brown-Out Detection Circuit".

* cited by examiner

*Primary Examiner* — Patrick O'Neill

(57) ABSTRACT

A data processing system (100), such as a System-on-Chip, includes a processor (120), a memory (140) that has an expected minimum data retention voltage, and a brown-out detector (160), which includes a brown-out detection circuit (201) that has an analog output, and an output circuit (248 and 252) that converts the analog output of the brown-out detection circuit to a digital brown-out flag. The brown-out detection circuit includes a self-biased current reference, current mirrors, and a current comparator. The brown-out detector monitors voltage of a power supply of the memory, and the brown-out detector asserts the digital brown-out flag to the processor when the voltage of the power supply is at, or slightly above, a highest expected minimum data retention voltage.

20 Claims, 3 Drawing Sheets

BROWN-OUT DETECTION CIRCUIT

BACKGROUND

1. Field

This invention relates generally to low voltage detection circuits and more specifically to a brown-out detection circuit disposed on an integrated circuit and fabricated using a complementary metal oxide semiconductor (CMOS) process.

2. Related Art

Some data processing or other electronic systems include a low power, or stand-by, mode where power is removed from most of the system during certain times to reduce power consumption. It is often desirable to maintain a power supply voltage to a small portion of the system, such as a static random access memory (SRAM), to retain certain critical memory contents. However, an SRAM requires a minimum data retention voltage to prevent data loss. During low power mode, the power supply voltage provided to the SRAM may become too low for reliable data retention. Also, a drop in the power supply voltage can occur anytime and can be due to a variety of reasons. When the supply voltage to the SRAM falls below the minimum data retention voltage, it is important to inform the system of the possibility of corrupted data.

A brown-out is a condition of low supply voltage ($V_{DD}$) in a system that adversely affects system operation. A brown-out may be caused by a variety of ordinary glitches, including inadequate power regulation, powering up or down system components, and software bugs. Portable electronic devices, such as cellular phones and cameras, are particularly susceptible to brown-outs because a connection between the device's battery and its terminals may be interrupted by even slight movements.

During a brown-out, if $V_{DD}$ drops below a required voltage of the system, data may be corrupted and the system may malfunction. Because the condition of circuit elements is lost during the brown-out, the system must then be reset to resume operation. Therefore, accurate brown-out detection is vital to ensuring reliable operation in most systems.

In general, a brown-out detection circuit is used to monitor the power supply voltage and to provide a warning when the monitored voltage falls below a predetermined voltage. The system can then take corrective action. More specifically, a brown-out detection circuit is used to detect when $V_{DD}$ falls below the minimum data retention voltage. A brown-out detection circuit is used to prevent data corruption and system malfunction. When $V_{DD}$ falls below the minimum data retention voltage, a brown-out detection circuit generates a system reset signal to set logic within the system to a known state. Therefore, when $V_{DD}$ returns to a stable operating potential, the system may resume operation from the reset state.

Known brown-out detection circuits are relatively inaccurate, so a relatively high voltage supply is required to assure correct system operation. As improving process technologies allow for the use of progressively lower power supply voltages, the accuracy of the brown-out detection circuit becomes more important.

The system typically has an unregulated voltage that varies between 0.9 to 5.0 volts, and the unregulated voltage is regulated to 1.2V±10%. When the unregulated voltage drops below 1.2V, the regulated voltage, $V_{DD}$, also drops below 1.2V. When $V_{DD}$ drops below a certain voltage (typically a voltage between 1.08V and 0.95V, if $V_{DD}$ is 1.2V), most of the circuits of the system should stop, and the system goes into standby mode. When a system is in stand-by mode, a brown-out detection circuit needs to continue to work, and needs to continue to monitor the voltage of the power supply for the SRAM. While in standby mode, no reads or writes can take place, but the SRAM retains data. When $V_{DD}$ drops below about 700 mV, the entire system, including the SRAM, should totally stop because the SRAM can not reliably retain data when $V_{DD}$ is below about 700 mV.

SRAM may perform reads and writes at an operating voltage of about 1.2V. An SRAM is not able to retain its contents at voltages below its brown-out voltage. For an SRAM that has an operating voltage of about 1.2V, the minimum data retention voltage can be as high as 700 mV. At or below the highest minimum data retention voltage, the contents of the SRAM may be compromised.

Most brown-out detection circuits monitor only the threshold of one type of transistor (for example, either NMOS or PMOS type). In such known brown-out detection circuits, the variation (such as with temperature or process) of the brown-out detection voltage and the variation (such as with temperature or process) of the minimum data retention voltage may not track each other accurately. Therefore, a higher than desirable threshold detection range is required to assure correct system operation. The threshold detection range is critical for smaller geometries due to the lower supply voltage.

The performance of known brown-out detection circuits varies with process and temperature. Some known brown-out detection circuits disadvantageously use polysilicon resistors, which vary with temperature and process differently than how NMOS and PMOS devices vary with temperature and process.

Many brown-out detection circuits are not area-efficient, and some brown-out detection circuits are power hungry and/or too complex for System-on-Chip ("SoC") applications. Some brown-out detection circuits employ open-base bipolar transistors that are seldom available in a standard CMOS process.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

As used herein, the term "bus" is used to refer to a plurality of signals or conductors which may be used to transfer one or more various types of information, such as data, addresses, control or status. The conductors as discussed herein may be illustrated or described in reference to being a single conductor, a plurality of conductors, unidirectional conductors or bidirectional conductors. However, different embodiments may vary the implementation of the conductors. For example, separate unidirectional conductors may be used rather than bidirectional conductors and vice versa. Also, a plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit or similar apparatus into its logically true or logically false state, respectively. If the logically true state is a logic level one, then the logically false state is a logic level zero. And if the logically true state is a logic level zero, then the logically false state is a logic level one.

Each signal described herein may be designed as positive or negative logic, where negative logic can be indicated by a bar over the signal name or an asterisk following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Figure 1:
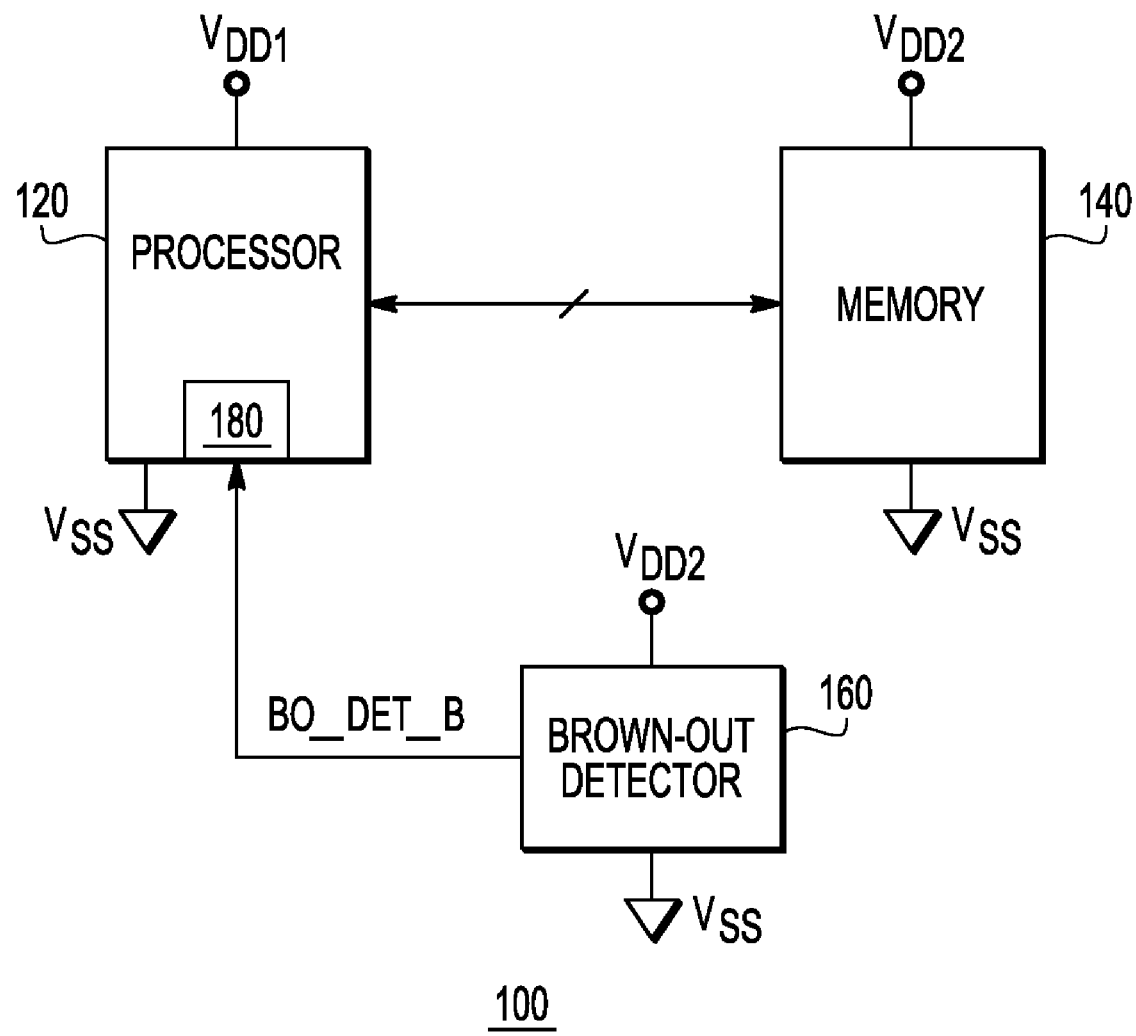
FIG. 1 illustrates, in block diagram form, a data processing system including a brown-out detector.

FIG. 1 illustrates, in block diagram form, a data processing system 100 in accordance with an embodiment of the invention. The data processing system 100 is a simplified data processing system and includes a processor 120, a memory 140 and a low-voltage, or brown-out, detector 160. The data processing system 100 may include other functional blocks and additional memory. In one embodiment, the data processing system 100 is implemented on an integrated circuit as a System-on-Chip (SoC). The data processing system 100 may be integrated using a conventional complementary metal-oxide semiconductor (CMOS) manufacturing process, or another manufacturing process. The processor 120 may be any kind of data processor, such as a microprocessor core, a microcontroller or a digital signal processor (DSP). The processor 120 is coupled to power supply voltage terminals, $V_{DD1}$ and $V_{SS}$, for receiving a power supply voltage. The processor 120 includes a register 180. The register 180 is a conventional register for storing one or more bits of information. The processor 120 may have additional registers that are not illustrated in FIG. 1.

The memory 140 is bi-directionally coupled to the processor 120 by a plurality of conductors. The plurality of conductors may comprise a system bus. In other embodiments, there may be other functional blocks coupled to the bus. The memory 140 includes power supply voltage terminals, $V_{DD2}$ and $V_{SS}$, for receiving a power supply voltage. The memory 140 includes a plurality of memory cells for storing data and/or instructions of use by processor 120. For example, the memory 140 may be a cache memory. Alternately, the memory 140 may be a register file having a cross-coupled latch. In the illustrated embodiment, the memory 140 is a static random access memory (SRAM).

The power supply voltage terminal $V_{DD1}$ is for receiving a first power supply voltage and the power supply voltage terminal $V_{DD2}$ is for receiving a second power supply voltage. The first and second power supply voltages may have of the same or different voltages. In one embodiment, $V_{DD1}$ and $V_{DD2}$ are coupled to a potential of 1.2V, and power supply voltage terminal $V_{SS}$ is coupled to ground potential (zero volts). The power supply voltages may be independently controlled. For example, the data processing system 100 may have a low power, or stand-by, operating mode for reducing power consumption when the processor 120 is not processing data. During the low power mode, the $V_{DD1}$ is removed from the processor 120, and $V_{DD2}$ continues to supply potential to the memory 140 to retain the data stored in the memory for possible use by the processor 120 when $V_{DD1}$ is restored. For example, in one embodiment, both $V_{DD1}$ and $V_{DD2}$ receive a power supply voltage of positive 1.2V during a normal operating mode. During low power mode, $V_{DD1}$ is reduced to zero volts while $V_{DD2}$ is maintained at 1.2V. In another embodiment, during the low power mode, the $V_{DD2}$ is reduced to a minimum data retention voltage of the memory 140 to further reduce power consumption. During the low power mode, a voltage level of the power supply voltage terminal $V_{SS}$ that is coupled to the memory 140 may be slightly increased above ground to further reduce power consumption.

The brown-out detector 160 is coupled to power supply voltage terminals $V_{DD2}$ and $V_{SS}$. The brown-out detector 160 monitors the power supply voltage $V_{DD2}$ provided to the memory 140. The brown-out detector 160 provides a brown-out detection signal labeled "BO_DET_B" to the register 180 of the processor 120. If the power supply voltage provided to the memory 140 drops below a predetermined minimum voltage, such as 0.85V, then the brown-out detection signal BO_DET_B is asserted to inform the processor 120 that the power supply voltage has dropped below the specified minimum data retention voltage for the memory 140. For example, in one embodiment, the minimum data retention voltage for the memory 140 may be 0.7V. In such embodiment, the brown-out detector 160 has a trip point of about 835 mV. The brown-out detector 160 asserts a brown-out flag about 50-150 mV higher than the highest expected minimum data retention voltage.

Figure 2:
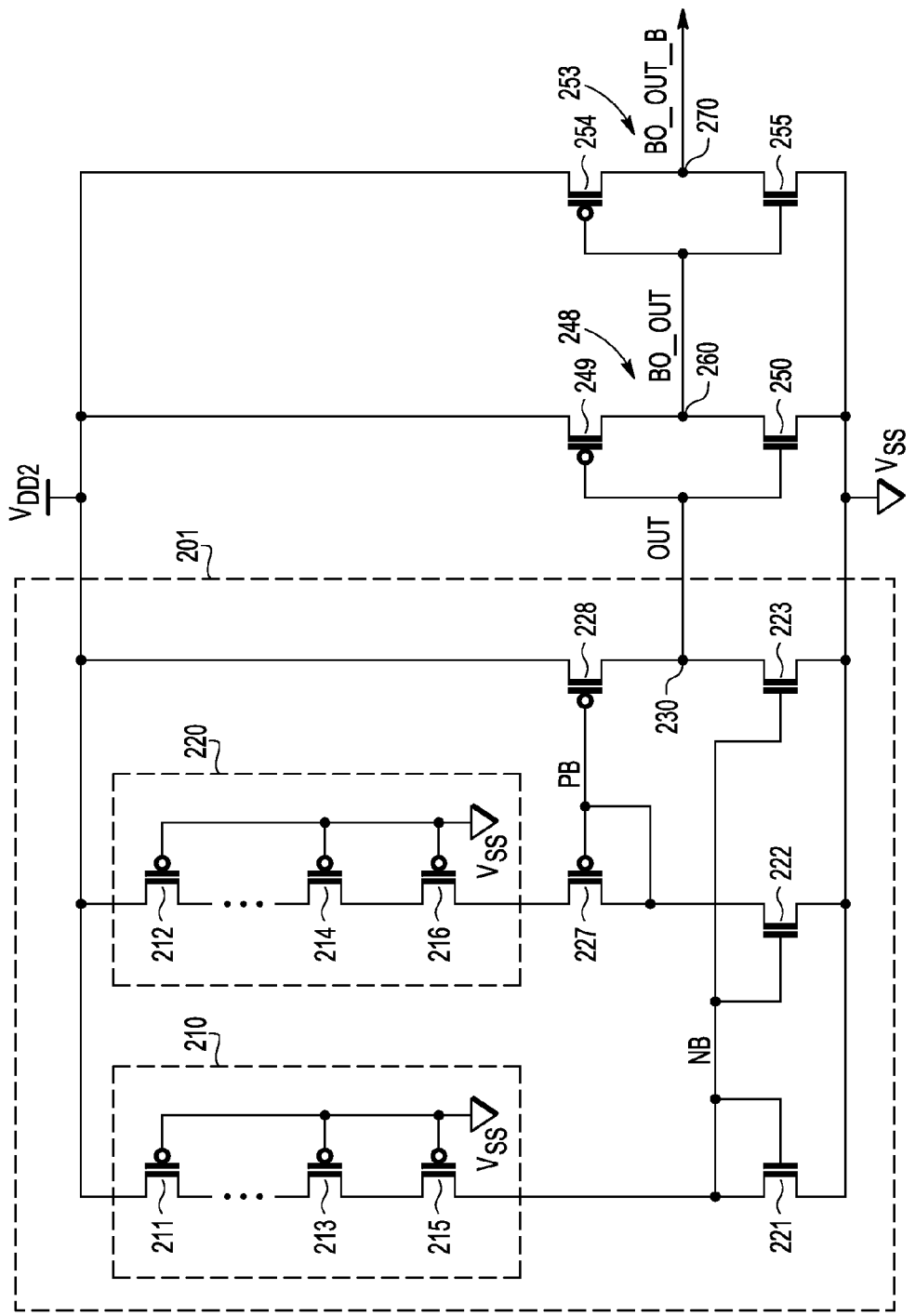
FIG. 2 illustrates, in schematic diagram form, one embodiment of the brown-out detector of FIG. 1.

FIG. 2 illustrates, in schematic diagram form, one embodiment of the brown-out detector 160. The brown-out detector 160 includes a low-voltage, or brown-out, detection circuit 201 that has an analog output, and an output circuit that converts the analog output of the brown-out detection circuit 201 to a digital output. The output circuit comprises a first inverter 248 that includes output transistors 249 and 250, and a second inverter 253 that includes output transistor 254 and 255. The brown-out detection circuit 201 includes a current reference, current mirrors, and a current comparator.

A self-biased current reference comprises resistive elements 211, 213 and 215 and NMOS transistor 221. The current reference is self-biased because the gate and drain terminals of each of the resistive elements 211, 213 and 215 are connected to $V_{SS}$, while the source terminal of each of the resistive elements is connected to $V_{DD2}$.

The brown-out detection circuit 201 has two mirrors. One minor comprises PMOS transistors 227 and 228. The current through PMOS transistor 228 tries to minor the current through PMOS transistor 227. Another minor comprises NMOS transistors 221, 222 and 223. NMOS transistors 222 and 223 try to minor the current through NMOS transistor 221.

The channel width to channel length ratio (W/L) of the control electrode of PMOS transistor 227 is equal to the W/L of the control electrode of PMOS transistor 228. The W/L of NMOS transistor 221 is equal to the W/L of NMOS transistor 222. However, the W/L of PMOS transistors 227 and 228 is different than the W/L of NMOS transistors 221 and 222. The W/L of NMOS transistor 223 is greater than the W/L of NMOS transistor 222. In one embodiment, the W/L of NMOS transistor 223 is twice the W/L of NMOS transistor 222.

The brown-out detection circuit 201 includes resistive elements 211, 213 and 215. Resistive elements 211, 213 and 215 are typically long channel devices. Resistive elements 211, 213 and 215 act as one long transistor. "Long", in one embodiment, means about 100 microns in 0.65 microns of channel length. In another embodiment, the resistive elements 211, 213 and 215 can be replaced with a single resistive element 210. In still another embodiment, the resistive elements 211, 213 and 215 can be replaced with one or more conventional resistors. The resistive elements 211, 213 and 215 provide a current path from $V_{DD2}$ to NMOS transistor 221.

The current comparator comprises PMOS transistors 227 and 228, and NMOS transistors 221, 222 and 223. The current comparator compares the current through resistive element 210 with the current through resistive element 211.

The brown-out detection circuit 201 also includes a NMOS transistor 221 that is connected as a diode, i.e., with its gate connected to its drain. The drain terminal of NMOS transistor 221 is coupled to resistive element 215, and the source terminal of NMOS transistor 221 is coupled to $V_{SS}$. The current flowing through NMOS transistor 221 is $V_{DD2}$ minus one MOS diode drop divided by the total resistance of resistive elements 211, 213 and 215. NMOS transistor 221 generates a voltage at its drain which becomes a bias voltage for NMOS transistors 222 and 223. A reference current, which generated by NMOS transistor 221, is mirrored one time in NMOS transistors 222 and two times in NMOS transistor 223, when $V_{DS}$ is the same for NMOS transistors 221, 222 and 223. Therefore, the total current consumed by the brown-out detection circuit 201 is about four times the current through NMOS transistor 221. In one embodiment, the current through NMOS transistor 221 (resistive elements 211, 213 and 215) is about 0.5 µA. The current through resistive elements 212, 214 and 216 and PMOS transistor 227 is mirrored in PMOS transistor 228. In one embodiment, there is about 0.5 µA going through PMOS transistor 227.

Resistive elements 212, 214 and 216 and PMOS transistor 227 help to maintain PMOS transistor 228 operating in the linear, or triode, region (i.e., low $R_{out}$) when $V_{DD2}$ is high or in normal range. Resistive elements 212, 214 and 216 are typically long channel devices. Resistive elements 212, 214 and 216 act as one long transistor.

The resistive elements 211, 212, 213, 214, 215 and 216 of the brown-out detection circuit 201, in one embodiment, are advantageously MOSFETs. It may be beneficial, but not necessary, that resistive elements 211, 213, 215, 212, 214 and 216 be of equal size.

When $V_{DD2}$ is normal to high: The high IR-drop across resistive elements 212, 214 and 216 causes PMOS transistor 228 is operating in the triode region (low $R_{out}$ for PMOS transistor 228), and NMOS transistor 223 in operating in the saturation region (high $R_{out}$ for NMOS transistor 223). When $V_{DD2}$ is above the trip point, the PMOS transistor 228 is stronger than the NMOS transistor 223. As a result, when $V_{DD2}$ is high, the output of the brown-out detector 160 at a node 230 between PMOS transistor 228 and NMOS transistor 223 is high because the voltage at node 230 is "pulled up" to the stronger device which is PMOS transistor 228. The purpose of NMOS transistor 222 is to produce a voltage at the gate of PMOS transistor 227.

When $V_{DD2}$ is low: The very low IR-drop across resistive elements 212, 214 and 216 causes PMOS transistor 228 to go into saturation (high $R_{out}$). Because the W/L of NMOS transistor 223 is larger than the W/L of NMOS transistor 222, when PMOS transistor 228 goes from triode to saturation, the drains of PMOS transistor 228 and NMOS transistor 223 go low, thereby causing brown-out detect to de-assert, i.e., the analog signal OUT goes low at node 230.

When $V_{DD2}$ is high, the current through PMOS transistor 228 is larger than the current through PMOS transistor 227 because the $V_{GS}$ of PMOS transistor 228 is larger than the $V_{GS}$ of PMOS transistor 227 by an amount equal to the voltage drop across resistive elements 212, 214 and 216, i.e., the voltage of three MOS $V_{DS}$ drops. The larger $V_{GS}$ of transistor 228 will cause PMOS transistor 228 to source more current than NMOS transistor 223 can sink. In other words, PMOS transistor 228 is stronger than NMOS transistor 223, which causes node 230 to be pulled high. However, when $V_{DD2}$ drops low enough, the IR-drop across resistive elements 212, 214 and 216 becomes small (about 0.1V or less); therefore, PMOS transistor 228 cannot source as much current as NMOS transistor 223 can sink. In other words, NMOS transistor 223 is stronger than PMOS transistor 228, and that causes node 230 to be pulled low.

Except at very low $V_{DD2}$ at which voltage the brown-out detection circuit 201 is not functional, a current density of NMOS transistor 222 is greater than a current density of NMOS transistor 223. More specifically, in one embodiment, a channel width of the control electrode of NMOS transistor 223 is larger than the channel width of the control electrode of NMOS transistor 222, and a channel length of the control electrode of NMOS transistor 223 is the same as the channel length of the control electrode of NMOS transistor 222, and the amount of current through NMOS transistor 223 is the same as the amount of current through NMOS transistor 222. In another embodiment, the channel width of the control electrode of NMOS transistor 223 is the same as the channel width of the control electrode of NMOS transistor 222, and the channel length of the control electrode of NMOS transistor 223 is the same as the channel length of the control electrode of NMOS transistor 222, and the amount of current through NMOS transistor 223 is the same as the amount of current through NMOS transistor 222.

The operation of the brown-out detector 160 can be explained as a current comparator. The current sourced by PMOS transistor 228 is compared against the current sunk by NMOS transistor 223. If the PMOS transistor 228 can source more current than the NMOS transistor 223 can sink, then node 230 is pulled up. If the NMOS transistor 223 can sink more than the PMOS transistor 228 can source, then node 230 is pushed down. The trip point occurs when the currents through PMOS transistor 228 and NMOS transistor 223 are equal. The trip point is the $V_{DD2}$ level at which node 230 transitions from logic high to logic low and vice versa. The trip point is directly proportional to the ratio of W/L of NMOS transistor 223 to the W/L of NMOS transistor 222. The larger the ratio, the higher the trip point, and vice versa. Larger current through NMOS transistor 223 requires higher current through PMOS transistor 228 to equalize it. This, in turn, requires higher $V_{GS}$ for PMOS transistor 228 and, in turn, requires a higher IR-drop across resistive elements 212, 214 and 216, and, in turn, requires higher $V_{DD2}$. This results in a higher trip point. Likewise, a lower trip point results from lower current through NMOS transistor 223.

Because that the currents through PMOS transistor 228 and NMOS transistor 223 are the same, as $V_{DD2}$ drops further, the PMOS transistor 228 decreases in current and cannot source enough current demanded by NMOS transistor 223 to keep it in saturation. The result is NMOS transistor 223 falling out of saturation and into the triode region, and its $V_{DS}$ falls to 0V, thereby causing node 230 to fall to zero volts. On the other hand, as $V_{DD2}$ rises, the PMOS transistor 228 increases in current and sources more current than NMOS transistor 223 can sink. The result is PMOS transistor 228 falling out of saturation and into the triode region, and its $V_{DS}$ falls to 0V, thereby causing node 230 to rise to $V_{DD2}$.

The voltage between the drain and source ($V_{DS}$) determines whether a transistor operates in the saturation region or in the triode region. In general, when $V_{DS} \geq V_{GS}-V_{TH}$, a transistor operates in the saturation region, where $V_{TH}$ is the transistor threshold voltage, and when $V_{DS}<V_{GS}-V_{TH}$, a transistor operates in the triode region. In the brown-out detector 160, when $V_{DD2}$ is low, the $V_{GS}$ of PMOS transistor 228 is low, and the condition $V_{DS}<V_{GS}-V_{TH}$ holds true, causing PMOS transistor 228 to operate in the saturation region. When $V_{DD2}$ is high (e.g., 1.2V), $V_{GS}$ of PMOS transistor 228 is high, and the condition $V_{DS}<V_{GS}-V_{TH}$ holds true, causing PMOS transistor 228 to operate in the triode region.

Figure 3:
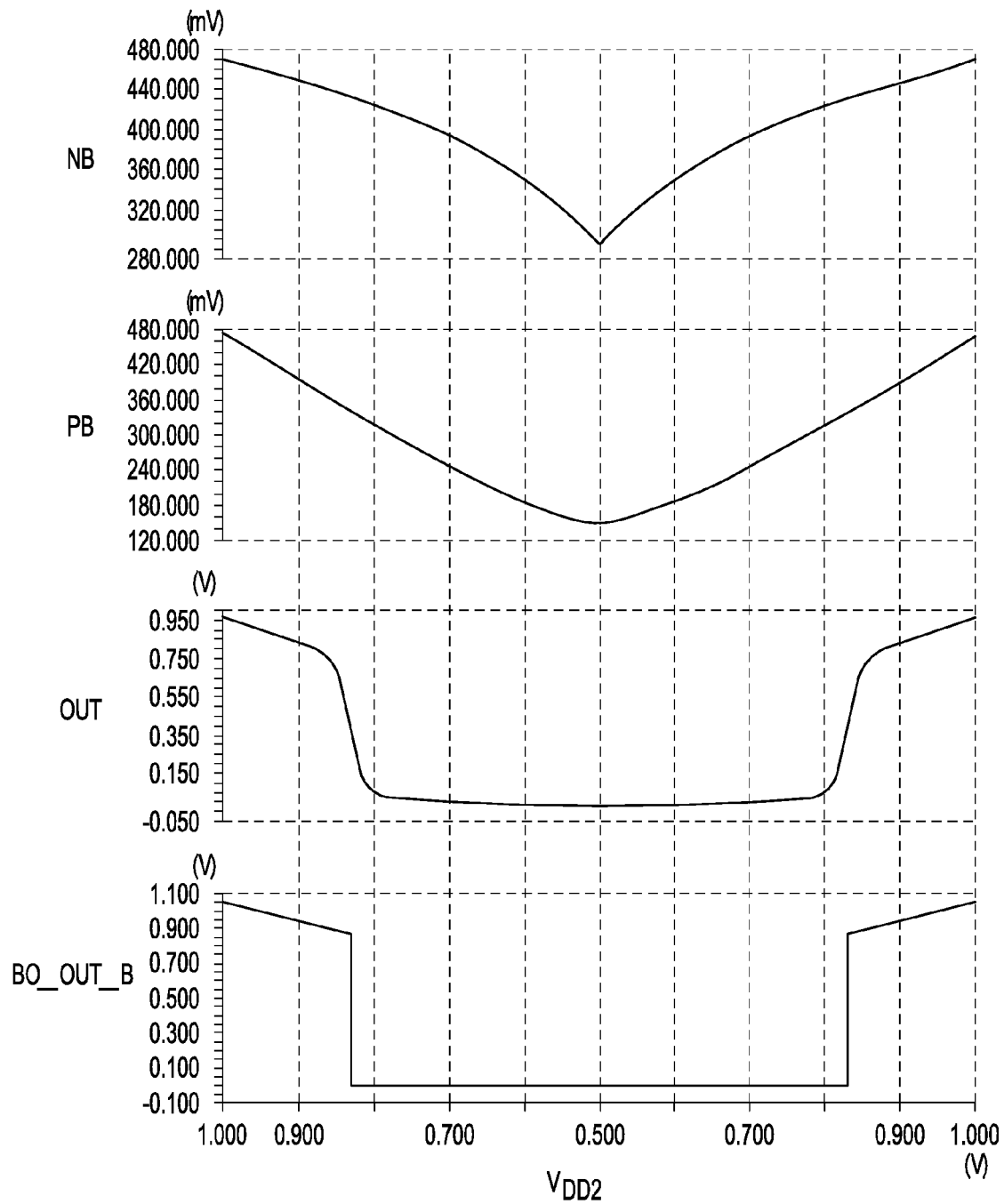
FIG. 3 illustrates a chart of operation of the brown-out detector of FIG. 2.

When $V_{DD2}$ is high, the voltage at node 230 between PMOS transistor 228 and NMOS transistor 223 is high. When $V_{DD2}$ is high, the analog output (the OUT signal) of the brown-out detection circuit 201 is high, and the voltage of the OUT signal is only a few millivolts less than $V_{DD2}$. For example, in one embodiment, as shown in FIG. 3, when the $V_{DD2}$ is high and at 1.0V, the voltage at the analog output (the OUT signal) of the brown-out detection circuit 201 is about 976 mV. When the $V_{DD2}$ is high and at 1.0V (and the analog output is about 976 mV), the BO_OUT_B signal, i.e., the voltage at the digital output of the brown-out detector 160 at node 270 is about 1.0V.

The operation of the brown-out detector 160 can be explained by comparing output impedances of PMOS transistor 228 and NMOS transistor 223. When $V_{DD2}$ is high, i.e., when there is enough supply voltage to retain data in the memory 140, node 230 between PMOS transistor 228 and NMOS transistor 223 is high. For example, when $V_{DD2}$ is high and at 1.2V, the voltage at node 230 is also close to 1.2V because PMOS transistor 228 is operating in the triode region and has low output impedance. On the other hand, NMOS transistor 223 is operating in the saturation region and has high output impedance. Therefore, when $V_{DD2}$ is high, PMOS transistor 228 acts as a low resistance and NMOS transistor 223 acts as a high resistance, which force the voltage at node 230 to be high and closer to the value of $V_{DD2}$ than to the value of $V_{SS}$. As a result, the analog OUT signal at node 230 and the digital BO_OUT signal at node 260 are low, and the digital BO_OUT_B signal at node 270 is high. If $V_{DD2}$ becomes slowly lower, then the IR drop across resistive elements 212, 214 and 216 becomes slowly smaller, which causes PMOS transistor 228 to go slowly into saturation.

When PMOS transistor 228 starts to go into saturation and can source less current, the fact that NMOS transistor 223 can sink more current than the current provided by PMOS transistor 228 causes NMOS transistor 223 to fall out of saturation into the triode region. NMOS transistor 223 has low output impedance when it is operating in the triode region. Therefore, when $V_{DD2}$ is low, PMOS transistor 228 acts as a high resistance and NMOS transistor 223 acts as a low resistance, which force the voltage at node 230 to be low and closer to the value of $V_{SS}$ than to the value of $V_{DD2}$. As a result, the analog OUT signal at node 230 and the digital BO_OUT signal at node 260 are high, and the digital BO_OUT_B signal at node 270 is low.

The voltage drop across the second path (resistive elements 212, 214 and 216, PMOS transistor 227 and NMOS transistor 222) is about one $V_{GS}$ (because PMOS transistor 227 is operating in the triode region) plus one $V_{DS}$. Therefore, the brown-out detector 160 functions properly at a $V_{DD2}$ as low as one $V_{GS}$ plus one $V_{DS}$, which is close to one threshold voltage (about 800 mV in one embodiment) of PMOS transistor 227. Therefore, advantageously, the brown-out detector 160 can continue to function at a $V_{DD2}$ as low as about 850 mV in such embodiment.

FIG. 3 illustrates a chart of operation 300 of the brown-out detector 160 when $V_{DD2}$ is nominally 1.2V and when the trip point is about 835 mV. As shown in FIG. 3, in one embodiment, when the output of the brown-out detector 160 is low, the OUT signal, i.e., the analog output of the brown-out detector 160 is about 4.4 mV. When $V_{DD2}$ is low (and the analog output is about 4.4 mV), the BO_OUT_B signal, i.e., the digital output of the brown-out detector 160 detector at node 270, is about 11 µV.

The brown-out detector 160 can advantageously generate a trip point at a lower voltage than the voltage of the trip point generated by some known brown-out detection circuits. The brown-out detector 160 can generate a trip point as low as about 750 mV. On the other hand, known brown-out detection circuits cannot generate a trip point as low as about 750 mV; the lowest trip point that can be generated by some known brown-out detection circuits is as high as about 1.5V.

In another embodiment, a resistor is placed between the source of NMOS transistor 223 and $V_{SS}$ to allow trimming by a smaller step than a step that would be caused by adding another transistor unit.

In one embodiment, the brown-out detector 160 can be made smaller than some known brown-out detection circuits by not using polysilicon resistors in the brown-out detector 160.

Some known brown-out detection circuits have a larger number of components than the brown-out detector 160 has, and, as a result, such known brown-out detector circuits disadvantageously use more power than the amount of power used by the brown-out detector 160. For example, in one embodiment, the maximum current consumption of the brown-out detector 160 is about 1 µA. (The maximum current consumption of the brown-out detector 160 depends, inter alia, on the sizes of resistive elements 211, 213, 215, 212, 214 and 216.) On the other hand, the maximum current consumption of at least one known brown-out detection circuit is about 1.5 µA.

The brown-out detector 160 is less prone to variation across process corners than are some known brown-out detection circuits, and the brown-out detector 160 is capable of tracking the retention voltage of static random access memory (SRAM) very accurately.

Advantageously, in some embodiments, there is no need for the transistors of the brown-out detector 160 and the transistors of the SRAM of the memory 140 to be of a same size or type. However, it may be beneficial, but not necessary, that the devices of the brown-out detector 160 be of a same size and type as the devices in the SRAM of the memory 140. Therefore, in another embodiment, the brown-out detector 160 includes transistors that model, or mimic, the transistors of memory cells of the SRAM. In such other embodiment, the brown-out detector 160 includes transistors that are substantially the same as, or similar to, in some respects, transistors of a memory cell of the memory 140. In such embodiment, such transistors model the threshold voltages of the pull-up and pull-down transistors of the memory cells. Therefore, in such embodiment, the brown-out detector 160 tracks process and temperature variations of the memory cells of the memory 140.

In the embodiment shown in FIG. 1, each of the transistors of the brown-out detector 160 is shown with its source isolated from the bulk. In another embodiment (not shown), none of the transistors of the brown-out detector 160 has a source that is isolated from the bulk, i.e., all the transistors of the brown-out detector 160 have a source that is connected to the bulk, which results in the brown-out detector 160 occupying a smaller area than the area occupied by the embodiment shown in FIG. 1.

In one embodiment, the brown-out detector 160 is fully compatible with the SRAM of the memory 140. All the PMOS devices of the brown-out detector 160 and of the SRAM are in a single well, and all the NMOS devices of the brown-out detector 160 and of the SRAM are in another single well. Therefore, there is no need for a third well having a third well potential. Advantageously, there is no need to isolate the devices of the brown-out detector 160 such as because the devices of the brown-out detector cannot tolerate the potentials in the wells for the SRAM.

The illustrated embodiment of the brown-out detector 160 uses a current mirror to achieve reliable low voltage detection while consuming power in the nanowatt power range. In one embodiment, the brown-out detector 160 uses CMOS transistors only (no resistors, capacitors or special devices are required) and achieves small silicon area (low cost) as well as compatibility with standard CMOS technologies (high reusability and low manufacturing cost). Advantageously, embodiments of the brown-out detector 160 do not need a separate voltage reference or current reference for operation.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the invention. The description of the architecture has been simplified for purposes of discussion, and it is one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that many other architectures can be implemented that achieve a same functionality. In an abstract, but still definite sense, any arrangement of components to achieve the same functionality is effectively "associated" such that a desired functionality is achieved. Hence, any two components herein combined to achieve a particular functionality can be seen as "associated with" each other such that the particular functionality is achieved, irrespective of architectures or intermedial components. Likewise, any two components so associated can also be viewed as being "operably connected" or "operably coupled" to each other to achieve the desired functionality.

In one embodiment, the illustrated elements of system 100 are circuitry located on a single integrated circuit or within a same device. In another embodiment, system 100 may include any number of separate integrated circuits or separate devices interconnected with each other. For example, memory 140 may be located on a same integrated circuit as processor 120 or on a separate integrated circuit or located within another peripheral or slave discretely separate from other elements of system 100.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention has been described with respect to specific conductivity types or polarity of potentials, skilled artisans appreciated that conductivity types and polarities of potentials may be reversed.

The specification and figures are to be regarded in an illustrative rather than a restrictive sense, and all such modifications are intended to be included within the scope of the present invention. Any benefits, advantages or solutions to problems described herein with regard to specific embodiments are not intended to be construed as a critical, required or essential feature or element of any or all the claims. Unless stated otherwise, terms such as "first" and "second" are used to arbitrarily distinguish between the elements such terms describe. Thus, these terms are not necessarily intended to indicate temporal or other prioritization of such elements. Note that the term "couple" has been used to denote that one or more additional elements may be interposed between two elements that are coupled.

Although the invention is described herein with reference to specific embodiments, various modifications and changes can be made without departing from the scope of the present invention as set forth in the claims below.

What is claimed is:

1. A low-voltage detection circuit, comprising:
    a voltage and current reference circuit for producing a reference current and a reference voltage;
    a first resistive element having one end coupled to a first power supply voltage terminal;
    a first transistor of a first conductivity type having a first current electrode coupled to another end of the first resistive element a second current electrode, and a control electrode connected to the second current electrode;
    a second transistor of a second conductivity type having a first current electrode coupled to the second current electrode of the first transistor, a control electrode coupled to the voltage and current reference circuit, and a second current electrode coupled to a second power supply voltage terminal wherein the second transistor is configured to minor the reference current;
    a third transistor of the first conductivity type having a first current electrode coupled to the first power supply voltage terminal, a second current electrode coupled to an output node, and a control electrode coupled to the control electrode of the first transistor; and
    a fourth transistor of the second conductivity type having a first current electrode coupled to the output node, a control electrode coupled to the voltage and current reference circuit, and a second current electrode coupled to the second power supply voltage terminal, wherein the fourth transistor is configured to mirror the reference current,
    wherein a voltage at the output node provides a low-voltage detection signal regarding a voltage at the first power supply voltage terminal.

2. The low-voltage detection circuit of claim 1, wherein the third transistor is configured to minor the current through the first transistor.

3. The low-voltage detection circuit of claim 1, wherein the voltage and current reference circuit is a self-biased voltage and current reference circuit.

4. The low-voltage detection circuit of claim 3, wherein the voltage and current reference circuit includes:
    a second resistive element having one end coupled to the first power supply voltage terminal, and
    a fifth transistor of a second conductivity type having a first current electrode coupled to another end of the second resistive element, a control electrode connected to the first current electrode, and a second current electrode coupled to the second power supply voltage terminal, wherein the reference voltage is produced at the first current electrode, and wherein the reference current is a current through the fifth transistor.

5. The low-voltage detection circuit of claim 1, wherein a channel width to channel length ratio (W/L) of the fourth transistor is larger than the W/L of the second transistor, and the low-voltage detection circuit is configured such that amount of current through the fourth transistor is the same as amount of current through the second transistor.

6. The low-voltage detection circuit of claim 1, wherein a channel width to channel length ratio (W/L) of the fourth transistor is the same as the W/L of the second transistor, and low-voltage detection circuit is configured such that amount of current through the fourth transistor is the same as amount of current through the second transistor.

7. The low-voltage detection circuit of claim 6, wherein the third transistor operates in triode region and the fourth transistor operates in saturation region, when the first power supply voltage terminal is above a low voltage condition, thereby producing a signal indicating a normal voltage condition.

8. The low-voltage detection circuit of claim 6, wherein the third transistor operates in saturation region and the fourth transistor operates in triode region, when the first power supply voltage terminal is at or below a low voltage condition, thereby producing a signal indicating a low voltage condition.

9. An integrated circuit including a low-voltage detector, comprising:
a voltage and current reference circuit for producing a reference current and a reference voltage;
a first resistive element having one end coupled to a first power supply voltage terminal and having another end;
a first transistor of a first conductivity type having a first current electrode coupled to the other end of the first resistive element, a second current electrode, and a control electrode connected to the second current electrode;
a second transistor of a second conductivity type having a first current electrode coupled to the second current electrode of the first transistor, a control electrode coupled to the voltage and current reference circuit, and a second current electrode coupled to a second power supply voltage terminal;
a third transistor of the first conductivity type having a first current electrode coupled to the first power supply voltage terminal, a second current electrode coupled to an output node, and a control electrode coupled to the control electrode of the first transistor;
a fourth transistor of the second conductivity type having a first current electrode coupled to the output node, a control electrode coupled to the voltage and current reference circuit, and a second current electrode coupled to the second power supply voltage terminal; and
an output circuit coupled to the output node for providing a detection signal indicative of a voltage at the first power supply voltage terminal.

10. The integrated circuit of claim 9, wherein the third transistor is configured to mirror the current through the first transistor.

11. The integrated circuit of claim 9, wherein the second transistor and the fourth transistor is configured to minor the reference current.

12. The integrated circuit of claim 11, wherein a current density of the second transistor is greater than a current density of the fourth transistor.

13. The integrated circuit of claim 9, wherein the third transistor operates in triode region and the fourth transistor operates in saturation region, when the first power supply voltage terminal is above a low voltage condition, thereby producing a signal indicating a normal voltage condition.

14. The integrated circuit of claim 9, wherein the third transistor operates in saturation region and the fourth transistor operates in triode region, when the first power supply voltage terminal is at or below a low voltage condition, thereby producing a signal indicating a low voltage condition.

15. A data processing system comprising:
a processor;
a memory, coupled to the processor, a first power supply voltage terminal and a second power supply voltage terminal, the memory having a brown-out voltage; and
a low-voltage detection circuit, coupled to the processor, the first power supply voltage terminal and the second power supply voltage terminal, the low-voltage detection circuit including:
a voltage and current reference circuit for producing a reference current and a reference voltage,
a first resistive element having one end coupled to a first power supply voltage terminal,
a first transistor of a first conductivity type having a first current electrode coupled to another end of the first resistive element, a second current electrode, and a control electrode connected to the second current electrode,
a second transistor of a second conductivity type having a first current electrode coupled to the second current electrode of the first transistor, a control electrode coupled to the voltage and current reference circuit, and a second current electrode coupled to a second power supply voltage terminal,
a third transistor of the first conductivity type having a first current electrode coupled to the first power supply voltage terminal, a second current electrode coupled to an output node, and a control electrode coupled to the control electrode of the first transistor, and
a fourth transistor of the second conductivity type having a first current electrode coupled to the output node, a control electrode coupled to the voltage and current reference circuit, and a second current electrode coupled to the second power supply voltage terminal, wherein a voltage at the output node indicates whether a voltage at the first power supply voltage terminal is at low voltage.

16. The data processing system of claim 15, wherein the processor is coupled to receive a signal indicating a low voltage condition as detected by the low-voltage detection circuit.

17. The data processing system of claim 15, wherein a channel width of the fourth transistor is larger than the channel width of the second transistor, wherein a channel length of the fourth transistor is the same as the channel length of the second transistor, and wherein the low-voltage detection circuit is configured such that amount of current through the fourth transistor is the same as amount of current through the second transistor.

18. The data processing system of claim 15, wherein a channel width of the fourth transistor is the same as the channel width of the second transistor, wherein a channel length of the fourth transistor is the same as the channel length of the second transistor, and wherein the low-voltage detection circuit is configured such that amount of current through the fourth transistor is the same as amount of current through the second transistor.

19. The data processing system of claim 15, wherein the third transistor operates in triode region and the fourth transistor operates in saturation region, when the first power supply voltage terminal is above the brown-out voltage, thereby producing an indication of a normal voltage condition.

20. The data processing system of claim 15, wherein the third transistor operates in saturation region and the fourth transistor operates in triode region, when the first power supply voltage terminal is at or below the brown-out voltage, thereby producing an indication of a low voltage condition.

* * * * *

UNITED STATES PATENT AND TRADEMARK OFFICE
CERTIFICATE OF CORRECTION

| | | |
|---|---|---|
| PATENT NO. | : 8,253,453 B2 | Page 1 of 2 |
| APPLICATION NO. | : 12/914168 | |
| DATED | : August 28, 2012 | |
| INVENTOR(S) | : Andre Luis Vilas Boas et al. | |

It is certified that error appears in the above-identified patent and that said Letters Patent is hereby corrected as shown below:

Title Page item 57

In the ABSTRACT, line 6:

change "252" to --253--.

Col. 4, line 48:

change "minor" to --mirror--.

Col. 4, line 49:

change "minor" to --mirror--.

Col. 4, line 50:

change "minor" to --mirror--.

Col. 4, line 52:

change "minor" to --mirror--.

Col. 10, in claim 1, line 31:

change "resistive element a second current electrode" to --resistive element, a second current electrode--.

Col. 10, in claim 1, line 39:

change "minor" to --mirror--.

Signed and Sealed this
Ninth Day of October, 2012

David J. Kappos
*Director of the United States Patent and Trademark Office*

Col. 10, in claim 2, line 56:

change "minor" to --mirror--.

Col. 11, in claim 6, line 16:

change "low-voltage detection circuit" to --the low-voltage detection circuit--.

Col. 11, in claim 11, line 63:

change "minor" to --mirror--.